(12) United States Patent
Lortie

(10) Patent No.: US 9,864,019 B2
(45) Date of Patent: Jan. 9, 2018

(54) MAGNETIC SENSOR SYSTEM

(71) Applicant: CAE INC., Montreal (CA)

(72) Inventor: Francis Lortie, Montreal (CA)

(73) Assignee: CAE INC., Saint-Laurent (CA)

( * ) Notice: Subject to any disclaimer, the term of this patent is extended or adjusted under 35 U.S.C. 154(b) by 1187 days.

(21) Appl. No.: 13/903,421

(22) Filed: May 28, 2013

(65) Prior Publication Data

US 2014/0111197 A1    Apr. 24, 2014

Related U.S. Application Data

(60) Provisional application No. 61/718,133, filed on Oct. 24, 2012.

(51) Int. Cl.
*G01R 33/02* (2006.01)
*G01V 3/18* (2006.01)
*G01R 33/028* (2006.01)

(52) U.S. Cl.
CPC ........... *G01R 33/02* (2013.01); *G01R 33/028* (2013.01)

(58) Field of Classification Search
CPC .............................. G01R 33/032; G01V 3/00
USPC .................................. 324/244, 301
See application file for complete search history.

(56) References Cited

U.S. PATENT DOCUMENTS

| | | | |
|---|---|---|---|
| 4,209,746 A | 6/1980 | Abramov et al. | |
| 5,182,514 A * | 1/1993 | Rice, Jr. | ......... 324/244 |
| 5,239,474 A | 8/1993 | Eaton, Jr. et al. | |
| 5,264,793 A | 11/1993 | Lo et al. | |
| 5,337,259 A | 8/1994 | Breed | |
| 5,387,863 A | 2/1995 | Lo et al. | |
| 5,444,373 A | 8/1995 | Johnson et al. | |
| 6,255,825 B1 | 7/2001 | Seigel et al. | |
| 6,888,353 B1 * | 5/2005 | Wiegert | ......... 324/345 |
| 6,903,676 B1 | 6/2005 | Frady et al. | |
| 7,049,998 B1 | 5/2006 | Frady et al. | |
| 7,564,031 B2 | 7/2009 | Fine et al. | |
| 7,579,828 B2 | 8/2009 | LaForest et al. | |

(Continued)

OTHER PUBLICATIONS

Guttin et al., An Isotropic Earth Field scalar Magnetometer Using Optically Pumped Helium 4, Jan. 1994.*

(Continued)

*Primary Examiner* — Bot Ledynh
(74) *Attorney, Agent, or Firm* — Fasken Martineau DuMoulin

(57) ABSTRACT

Magnetic sensor system including an assembly comprising first, second, and third scalar point-sensor magnetometers being fixedly mounted with respect to one another such that the position of each magnetometer's axis is invariable with respect to the other magnetometers' axes. When the sensor assembly is in operation, each magnetometer's axis forms an angle with ambient magnetic field lines. Each magnetometer has an operating range defined with respect to a range of values of the angle formed by its axis and the ambient magnetic field. The magnetometers are positioned such that at least one of magnetometers is within its operating range at any point in time. Each magnetometer has an output signal. Computer processor determines which of the output signals is to be used any particular point in time in the sensing of local variations in the ambient magnetic field. Method of operation of the magnetic sensor system/assembly is disclosed.

21 Claims, 9 Drawing Sheets

(56) References Cited

U.S. PATENT DOCUMENTS 8,125,221 B2 2/2012 Muthers
2011/0273172 A1 11/2011 Riedmueller et al.

OTHER PUBLICATIONS

"A Compact, Low-Cost, Isotropic Atomic Magnetometer Navy SBIR FY 2010.2", Twinleaf Proposal No. N102-134-1031, http://www.navysbir.com/10_2/75.htm, unknown date.
"Ultra-sensitive atomic magnetometer system for airborne magnetic anomaly detection", Tristan Technologies Proposal No., http://www.sbir.gov/sbirsearch/detail/338553, unknown date.
"UAV Laser MAD System", Polatomic DoD Navy Contract., http://www.sbir.gov/sbirsearch/detail/277915, unknown date.
Cranch et al., "All-Optical, Three-Axis Fiber Laser Magnetometer," Naval Research Laboratory, Fiber Optics Technology Branch, Optical Sciences Division. Apr. 16, 2012.

\* cited by examiner

MAGNETIC SENSOR SYSTEM

CROSS-REFERENCE TO RELATED APPLICATIONS

The present application claims priority to U.S. provisional patent application Ser. No. 61/718,133, filed Oct. 24, 2012, entitled "Magnetic Anomaly Detector", the contents of which are incorporated herein by reference.

FIELD

The present specification relates to magnetic sensor systems and magnetic sensor system assemblies.

BACKGROUND

Magnetic sensor systems may be used to detect bodies of subsurface ferromagnetic material. Examples of such bodies include vessels, ore bodies, pipelines, etc. Typically, magnetic sensor systems have magnetic sensor assemblies that are mounted on aerial vehicles, such as airplanes or helicopters, which fly over a surface under which a ferromagnetic material may be located.

Conventional magnetic sensor assemblies typically include a magnetometer capable of detecting local variations in the ambient magnetic field (e.g. the Earth's magnetic field) caused by the presence of the body of subsurface ferromagnetic material. Different conventional suitable magnetometers exist; however, optical pumping magnetometers are commonly used because of their precision in detecting such local variations. An example of a type of conventional optical pumping magnetometer is described in U.S. Pat. No. 4,209,746, entitled "Magnetic Field Gradient Measuring Device", issued to Abramov et al., on Jun. 24, 1980; which is incorporated herein by reference.

A difficulty with conventional magnetic sensor assemblies incorporating magnetometers having the precision necessary to function well in such systems is that such magnetometers have an axis (typically a central longitudinal axis) and they will only function when the angle formed between their axis and the field lines of the ambient magnetic field is within a certain, relatively limited, range which may be termed the "operational range" of the magnetometer.

Given the movement of the aerial vehicle in which such magnetic sensor assemblies are located as well as large-scale variations in ambient magnetic field, some conventional installations of magnetic sensor assemblies have mechanical systems to reorient the magnetometer as necessary to attempt to maintain the magnetometer within its operational range (For example, when the aerial vehicle's orientation and/or position change.)

Such mechanical systems add complexity to magnetic sensor assembly installations, and such mechanical systems may fail, rendering magnetic sensing inoperative until the mechanical system is repaired.

Other convention magnetic sensor assemblies avoid the problems created by having such mechanical systems simply by being fixedly secured to the aerial vehicle, and the magnetic sensor systems of which they are a part only being operable within the magnetic sensor assembly's operational range.

SUMMARY

It is an object of the technology disclosed in the present specification to ameliorate at least one inconvenience present in some prior art magnetic sensor systems and magnetic sensor assemblies (be it one of those described hereinabove or another inconvenience not described herein).

It is a further object of the technology disclosed in the present specification to provide for an improvement in magnetic sensing.

Thus, in one aspect, some embodiments of the present technology provide a magnetic sensor system suitable for sensing of local variations in an ambient magnetic field caused by a mass of ferromagnetic material. The magnetic sensor system comprises at least a magnetic sensor assembly that includes:

A first scalar point-sensor magnetometer, the first scalar magnetometer having a first scalar magnetometer axis.

A second scalar point-sensor magnetometer, the second scalar magnetometer having a second scalar magnetometer axis.

A third scalar point-sensor magnetometer, the third scalar magnetometer having a third scalar magnetometer axis.

The first scalar magnetometer, the second scalar magnetometer, and the third scalar magnetometer are fixedly mounted with respect one another such that (i) the position of each of the scalar magnetometer axes is invariable with respect to the other scalar magnetometer axes, and (ii) when the magnetic sensor assembly is in operation, at any particular point in time, the first scalar magnetometer axis forms a first angle with magnetic field lines of the ambient magnetic field at a location of the magnetic sensor assembly in a first plane defined by the first scalar magnetometer axis and the magnetic field lines, the second scalar magnetometer axis forms a second angle with the magnetic field lines of the ambient magnetic field at the location of the magnetic sensor assembly in a second plane defined by the second scalar magnetometer axis and the magnetic field lines, and the third scalar magnetometer axis forms a third angle with the magnetic field lines of the ambient magnetic field at the location of the magnetic sensor assembly in a third plane defined by the third scalar magnetometer axis and the magnetic field lines.

The first scalar magnetometer has a first scalar magnetometer operating range defined with respect to a range of values of the first angle. The second scalar magnetometer has a second scalar magnetometer operating range defined with respect to a range of values of the second angle. The third scalar magnetometer has a third scalar magnetometer operating range defined with respect to a range of values of the third angle.

The first scalar magnetometer, the second scalar magnetometer, and the third scalar magnetometer are positioned with respect to one another such that, at the particular point in time, at least one of: the first angle is within the first scalar magnetometer operating range, the second angle is within the second scalar magnetometer operating range, and the third angle is within the third scalar magnetometer operating range.

The magnetic sensor system also comprises a non-transient computer-readable information storage medium storing program instructions that when executed by a computer processor determine which of the first output signal, the second output signal, and the third output signal is to be used at the particular point in time in the sensing of local variations in the ambient magnetic field.

In some embodiments, the first scalar magnetometer has a first output signal, the second scalar magnetometer has a second output signal, and the third scalar magnetometer has a third output signal. The magnetic sensor system also comprises at least one frequency-to-digital converter converting the first output signal to a first digital output signal, the second output signal to a second digital output signal, and the third output signal to a third digital output signal. The magnetic sensor system also comprises a computer processor being in communication with the at least one frequency-to-digital converter to receive the digital output signals therefrom.

In some embodiments, the non-transient computer-readable information storage medium stores program instructions that when executed by the computer processor determines which of the first output signal, the second output signal, and the third digital signal is to be used at the particular point in time in the sensing of local variations in the ambient magnetic field based, at least in part, on which of the scalar magnetometers has its angle within its operating range at the particular point in time.

In some embodiments, at the particular point in time, more than one of the scalar magnetometers has its angle within its operating range.

In some embodiments, the non-transient computer-readable information storage medium stores program instructions that when executed by the computer processor determine which of the first output signal, the second output signal, and the third output signal is to be used at the particular point in time in the sensing of local variations in the ambient magnetic field based, at least in part, on a strength of the scalar magnetometer output signals.

In some embodiments, the non-transient computer-readable information storage medium stores program instructions that when executed by the computer processor determine which of the first output signal, the second output signal, and the third output signal is to be used at the particular point in time in the sensing of local variations in the ambient magnetic field based, at least in part, on which one of the output signals was being used immediately prior to the particular point in time.

In some embodiments, the first scalar magnetometer, the second scalar magnetometer, and the third scalar magnetometer are positioned one with respect to another to form a pyramidal structure.

In some embodiments, the first scalar magnetometer, the second scalar magnetometer, and the third scalar magnetometer are positioned in-line with respect to one another.

In some embodiments, a fourth angle defined between an intersection of the first scalar magnetometer axis and a plane parallel to both the second scalar magnetometer axis and the third scalar magnetometer axis is between 35° and 55° (inclusive), or between 125° and 145° (inclusive), or between 215° and 235° (inclusive), or between 305° and 325° (inclusive); a fifth angle defined between an intersection of the second scalar magnetometer axis and a plane parallel to both the first scalar magnetometer axis and the third scalar magnetometer axis is between 35° and 55° (inclusive), or between 125° and 145° (inclusive), or between 215° and 235° (inclusive), or between 305° and 325° (inclusive); and a sixth angle defined between an intersection of the third scalar magnetometer axis and a plane parallel to both the first scalar magnetometer axis and the second scalar magnetometer axis is between 35° and 55° (inclusive), or between 125° and 145° (inclusive), or between 215° and 235° (inclusive), or between 305° and 325° (inclusive).

In some embodiments, the first scalar magnetometer operating range is between 10° and 80° (inclusive) and between 100° and 170° (inclusive); the second scalar magnetometer operating range is between 10° and 80° (inclusive) and between 100° and 170° (inclusive); and the third scalar magnetometer operating range is between 10° and 80° (inclusive) and between 100° and 170° (inclusive).

In some embodiments, each of the scalar magnetometers is an optical pumping magnetometer.

In some embodiments, the magnetic sensor system further comprises a vector magnetometer. In some embodiment, the vector magnetometer has a fourth analog output signal, a fifth analog output signal, and a sixth analog output signal. At least one analog-to-digital converter converts the fourth analog output signal to a fourth digital output signal, the fifth analog output signal to a fifth digital output signal, and the sixth analog output signal to a sixth digital output signal.

In some embodiments, the magnetic sensor assembly is carried by (mounted on) a moving vehicle.

In another aspect, in some embodiments, the present technology provides a method of operating a magnetic sensor system suitable for sensing of local variations in an ambient magnetic field caused by a mass of ferromagnetic material the magnetic sensor system having a sensor assembly including, at least:

A first scalar point-sensor magnetometer, the first scalar magnetometer having a first scalar magnetometer axis.

A second scalar point-sensor magnetometer, the second scalar magnetometer having a second scalar magnetometer axis.

A third scalar point-sensor magnetometer, the third scalar magnetometer having a third scalar magnetometer axis.

The first scalar magnetometer, the second scalar magnetometer, and the third scalar magnetometer being fixedly mounted with respect one another such that (i) the position of each of the scalar magnetometer axes is invariable with respect to the other scalar magnetometer axes, and (ii) when the magnetic sensor assembly is in operation, at any particular point in time, the first scalar magnetometer axis forms a first angle with magnetic field lines of the ambient magnetic field at a location of the magnetic sensor assembly in a first plane defined by the first scalar magnetometer axis and the magnetic field lines, the second scalar magnetometer axis forms a second angle with the magnetic field lines of the ambient magnetic field at the location of the magnetic sensor assembly in a second plane defined by the second scalar magnetometer axis and the magnetic field lines, and the third scalar magnetometer axis forms a third angle with the magnetic field lines of the ambient magnetic field at the location of the magnetic sensor assembly in a third plane defined by the third scalar magnetometer axis and the magnetic field lines.

The first scalar magnetometer has a first scalar magnetometer operating range defined with respect to a range of values of the first angle. The second scalar magnetometer has a second scalar magnetometer operating range defined with respect to a range of values of the second angle. The third scalar magnetometer has a third scalar magnetometer operating range defined with respect to a range of values of the third angle.

The first scalar magnetometer, the second scalar magnetometer, and the third scalar magnetometer are positioned with respect to one another such that, at the particular point in time, at least one of: the first angle is within the first scalar magnetometer operating range, the second angle is within the second scalar magnetometer operating range, and the third angle is within the third scalar magnetometer operating range.

The method comprises:

Receiving, by a computer processor in electronic communication with the first scalar magnetometer, a first output signal from the first scalar magnetometer.

Receiving, by the computer processor in electronic communication with the second scalar magnetometer, a second output signal from the second scalar magnetometer, the second output signal being distinct from the first output signal.

Receiving, by the computer processor in electronic communication with the third scalar magnetometer, a third output signal from third scalar magnetometer, the third output signal being distinct from both the first output signal and the second output signal.

Determining, via the computer processor, which of the first output signal, the second output signal and the third output signal to use at the particular point in time in the sensing of local variations in the ambient magnetic field.

In some embodiments, determining, via the computer processor, which of the first output signal, the second output signal and the third output signal to use at the particular point in time in the sensing of local variations in the ambient magnetic field, is determining, at least in part, which of the first output signal, the second output signal and the third output signal to use at the particular point in time in the sensing of local variations in the ambient magnetic field, based, at least in part, on which of the scalar magnetometers has its angle within its operating range at the particular point in time.

In some embodiments, at the particular point in time, more than one of the scalar magnetometers has its angle within its operating range.

In some embodiments, determining, via the computer processor, which of the first output signal, the second output signal and the third output signal to use at the particular point in time in the sensing of local variations in the ambient magnetic field, is determining, at least in part, which of the first output signal, the second output signal and the third output signal to use at the particular point in time in the sensing of local variations in the ambient magnetic field, based, at least in part, on a strength of the scalar magnetometer output signals.

In some embodiments, determining, via the computer processor, which of the first output signal, the second output signal and the third output signal to use at the particular point in time in the sensing of local variations in the ambient magnetic field, is determining, at least in part, which of the first output signal, the second output signal and the third output signal to use at the particular point in time in the sensing of local variations in the ambient magnetic field, based, at least in part, on which one of the digital output signals was being used immediately prior to the particular point in time.

In some embodiments, the method further comprises:

Prior to receiving, by the computer processor in electronic communication with the first scalar magnetometer, the first output signal from the first scalar magnetometer, converting the first output signal to a first digital output signal.

Prior to receiving, by the computer processor in electronic communication with the second scalar magnetometer, the second output signal from the second scalar magnetometer, converting the second output signal from to a second digital output signal.

Prior to receiving, by the computer processor in electronic communication with the third scalar magnetometer, the third output signal from the third scalar magnetometer, converting the third output signal to a third digital output signal.

In another aspect, in some embodiments, the present technology provides a magnetic sensor assembly suitable for use in a magnetic sensor system for sensing local variations in an ambient magnetic field caused by a mass of ferromagnetic material. The sensor assembly comprises:

A first scalar point-sensor magnetometer, the first scalar magnetometer having a first scalar magnetometer axis.

A second scalar point-sensor magnetometer, the second scalar magnetometer having a second scalar magnetometer axis.

A third scalar point-sensor magnetometer, the third scalar magnetometer having a third scalar magnetometer axis.

The first scalar magnetometer, the second scalar magnetometer, and the third scalar magnetometer are fixedly mounted with respect one another such that (i) the position of each of the scalar magnetometer axes is invariable with respect to the other scalar magnetometer axes, and (ii) when the magnetic sensor assembly is in operation, at any particular point in time, the first scalar magnetometer axis forms a first angle with magnetic field lines of the ambient magnetic field at a location of the magnetic sensor assembly in a first plane defined by the first scalar magnetometer axis and the magnetic field lines, the second scalar magnetometer axis forms a second angle with the magnetic field lines of the ambient magnetic field at the location of the magnetic sensor assembly in a second plane defined by the second scalar magnetometer axis and the magnetic field lines, and the third scalar magnetometer axis forms a third angle with the magnetic field lines of the ambient magnetic field at the location of the magnetic sensor assembly in a third plane defined by the third scalar magnetometer axis and the magnetic field lines.

The first scalar magnetometer has a first scalar magnetometer operating range defined with respect to a range of values of the first angle. The second scalar magnetometer has a second scalar magnetometer operating range defined with respect to a range of values of the second angle. The third scalar magnetometer has a third scalar magnetometer operating range defined with respect to a range of values of the third angle.

The first scalar magnetometer, the second scalar magnetometer, and the third scalar magnetometer are positioned with respect to one another such that, at the particular point in time, at least one of: the first angle is within the first scalar magnetometer operating range, the second angle is within the second scalar magnetometer operating range, and the third angle is within the third scalar magnetometer operating range.

As was discussed hereinabove, in some embodiments, the first scalar magnetometer, the second scalar magnetometer, and the third scalar magnetometer are positioned one with respect to another to form a pyramidal structure.

As was discussed hereinabove, in some embodiments, a fourth angle defined between an intersection of the first scalar magnetometer axis and a plane parallel to both the second scalar magnetometer axis and the third scalar magnetometer axis is between 35° and 55° (inclusive), or between 125° and 145° (inclusive), or between 215° and 235° (inclusive), or between 305° and 325° (inclusive);

a fifth angle defined between an intersection of the second scalar magnetometer axis and a plane parallel to both the first scalar magnetometer axis and the third scalar magnetometer axis is between 35° and 55° (inclusive), or between 125° and 145° (inclusive), or between 215° and 235° (inclusive), or between 305° and 325° (inclusive); and a sixth angle defined between an intersection of the third scalar magnetometer axis and a plane parallel to both the first scalar magnetometer axis and the second scalar magnetometer axis is between 35° and 55° (inclusive), or between 125° and 145° (inclusive), or between 215° and 235° (inclusive), or between 305° and 325° (inclusive).

In some embodiments, the magnetic sensor assembly has more than three scalar magnetometers. In some such embodiments, the magnetic sensor assembly has four, five, or six (for example) scalar magnetometers.

Embodiments of the present invention each have at least one of the above-mentioned object and/or aspects, but do not necessarily have all of them. It should be understood that some aspects of the present invention that have resulted from attempting to attain the above-mentioned object may not satisfy this object and/or may satisfy other objects not specifically recited herein.

Additional and/or alternative features, aspects, and advantages of embodiments of the present invention will become apparent from the following description, the accompanying drawings, and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

DETAILED DESCRIPTION

Figure 1:
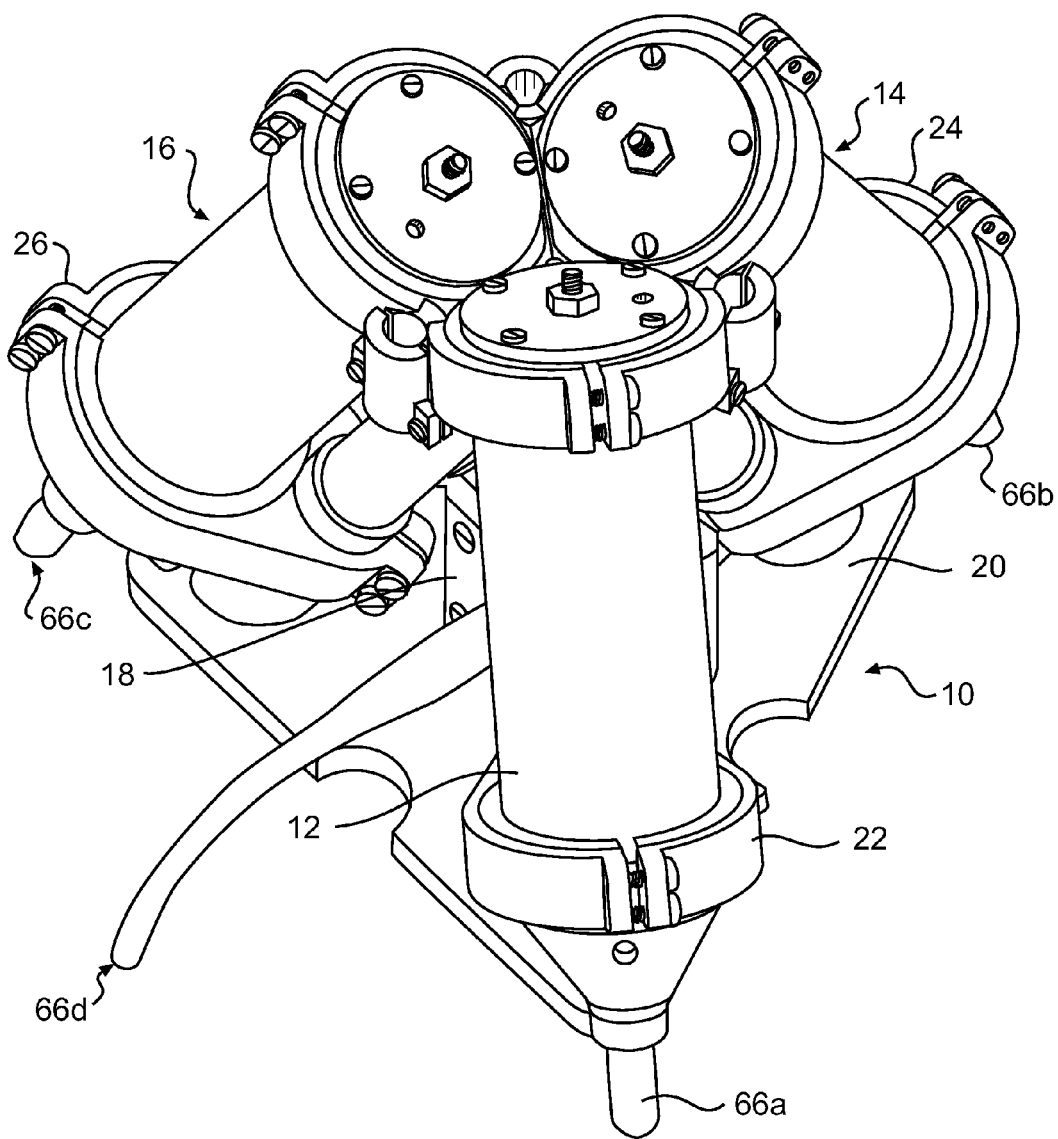
FIG. 1 is perspective view of a magnetic sensor assembly being a first embodiment of the present technology.

Referring to FIG. 1 there is a shown a magnet sensor assembly 10 being an embodiment of the present technology. The magnetic sensor assembly 10 is part of a magnetic sensor system 80, other components of which are described hereinbelow. It is to be expressly understood that magnetic sensor assembly 10 (and the magnetic sensor system 80 of which it is a part) are merely a preferred embodiments of the present technology. The description thereof that follows is intended to be only a description of a physical example of the present technology. This description is not intended to define the scope or set forth the bounds of the present technology. In some cases, what are believed to be helpful examples of modifications to the magnetic sensor assembly 10 or the magnetic sensor system 80 are also set forth hereinbelow. This is done merely as an aid to understanding, and, again, not to define the scope or set forth the bounds of the present technology. These modifications are not exhaustive list, and, as a person skilled in the art would understand, other modifications are likely possible. Further, it should not be interpreted that where this has not been done, i.e. where no examples of modifications have been set forth, that no modifications are possible and/or that what is described is the sole physical means of embodying that element of the present technology. As a person skilled in the art would understand, this is likely not the case.

Magnet sensor assembly 10 is suitable for sensing local variations in an ambient magnetic field caused by a mass of ferromagnetic material. In this embodiment, magnet sensor assembly 10 includes three scalar point-sensor magnetometers, a first scalar point-sensor magnetometer 12, a second scalar point-sensor magnetometer 14, and a third point sensor magnetometer 16. As was discussed hereinabove, in other embodiments a different number of point-scalar magnetometers may be present. In this embodiment, magnetic sensor assembly 10 also includes a vector magnetometer 18. (In this embodiment, vector magnetometer 18 is a Mag629™ three-axis fluxgate magnetic field sensor from Bartington Instruments™ of Whitney, Oxfordshire, England, U.K. In other embodiments other similar commercially available magnetometers could be employed.)

Magnet sensor assembly 10 is created, in this embodiment, via each of the scalar magnetometers 12, 14, 16 and the vector magnetometer 18 being fixedly mounted to a single plate 20. In other embodiments, other suitable structures could be used in addition to, or in place of, plate 20. In this embodiment, vector magnetometer 18 is directly fixedly mounted to plate 20. In other embodiments, vector magnetometer 18 could be mounted to and/or via other structures. In this embodiment, the first scalar magnetometer 12 is fixedly mounted to plate 20 via first mounting assembly 22; the second scalar magnetometer 14 is fixedly mounted to plate 20 via second mounting assembly 24; and the third scalar magnetometer 16 is fixedly mounted to plate 20 via third mounting assembly 26.

Figure 2:
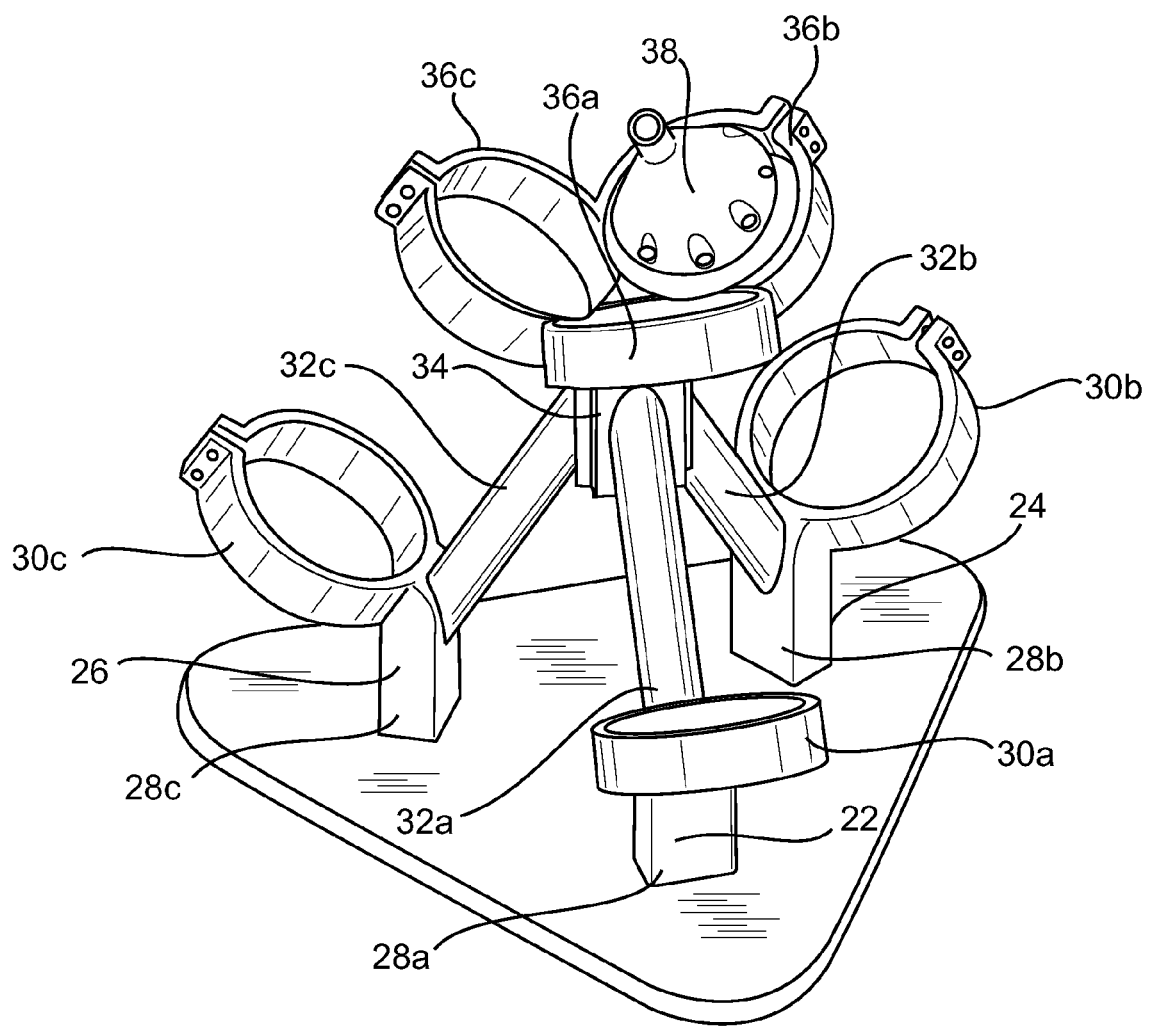
FIG. 2 is a perspective view of the magnetic sensor assembly of FIG. 1, with the magnetometers removed.

FIG. 2, shows the plate 20 and the mounting assemblies 22, 24, and 26 of magnetic sensor assembly 10 alone, with the scalar magnetometers 12, 14, 16 and the vector magnetometer 18.

In this embodiment, each mounting assembly 22, 24, 26 consists of a support 28a, 28b, 28c which is fixedly mounted onto plate 20. Attached to each support 28a, 28b, 28c is a lower collar 30a, 30b, 30c. Lower collar 30a is used to secure a lower portion of first scalar magnetometer 12. Lower collar 30b is used to secure a lower portion of second scalar magnetometer 14. Lower collar 30c is used to secure a lower portion of third scalar magnetometer 16. Also attached to search support 28a, 28b, 28c is an arm 32a, 32b, 32c (respectively), and specifically the lower end of the arm. Arms 32a, 32b, 32c extend upwardly and inwardly from supports 28a, 28b, 28c. The upper end of each arm 32a, 32b, 32c is attached a single central support 34. Also attached to the single central support 34 are three upper collars 36a, 36b, 36c corresponding to lower collars 30a, 30b, 30c (respectively). Upper collar 36a is used to secure an upper portion of first scalar magnetometer 12. Upper collar 36b is used to secure an upper portion of second scalar magnetometer 14.

Upper collar 36c is used to secure an upper portion of third scalar magnetometer 16. The above description of the mounting assemblies 22, 24, 26 is only a non-limiting example. In other embodiments, other suitable mounting structures or mounting assemblies may be employed.

In this embodiment, the plate 20 and the mounting assemblies 22, 24, 26 are each made of Utlem™, a polyetherimide thermoplastic available from SABIC™ of Riyadh, Saudi Arabia. In other embodiments, each of the foregoing components (or whatever other structural components are present) may be manufactured from any suitable non-magnetic material, e.g. metals, plastics, composites, etc. It is not necessary that the various structural components be manufactured from the same material. In some embodiments, e.g. magnetic sensor assembly 10 is the case; in others, it will not be the case.

Figure 3:
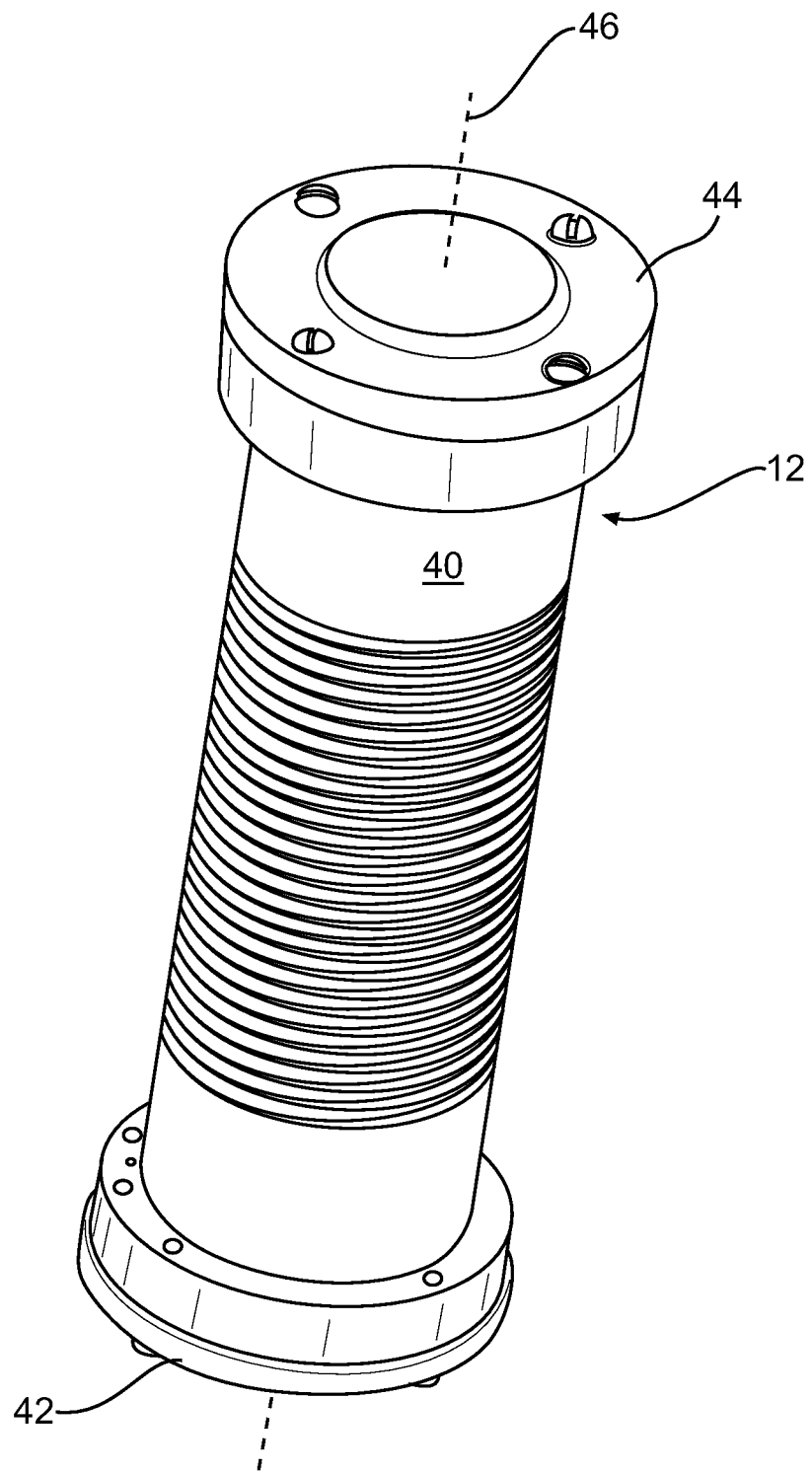
FIG. 3 is a close up view of a magnetometer of the magnetic sensor assembly of FIG. 1.

FIG. 3 shows first scalar magnetometer 12 apart from the magnetic sensor assembly 10. (Second scalar magnetometer 14 and third scalar magnetometer 16 are identical to first scalar magnetometer 12 in this embodiment and will not be separately described herein.) In this embodiment, first scalar magnetometer 12 is a scalar point-sensor optical pumping magnetometer manufactured and sold by CAE Inc. of Montreal, Canada as a part of magnetic sensor assembly model AN/ASQ-508. The use of this particular magnetometer is only intended to be a non-limiting example. The present technology is not restricted to this particular magnetometer or to magnetometers of this type. Any suitable magnetometer may be used in other embodiments of the present technology. Moreover, while in the present embodiment, the first scalar magnetometer 12, the second scalar magnetometer 14, and the third scalar magnetometer 16 are all identical, this is not necessarily the case. In other embodiments, some or all of the various magnetometers may be the same and/or, others may be different. As the internal workings of scalar magnetometers in general and the specific model referred to above are conventional, no further information thereon is provided herein.

Figure 4:
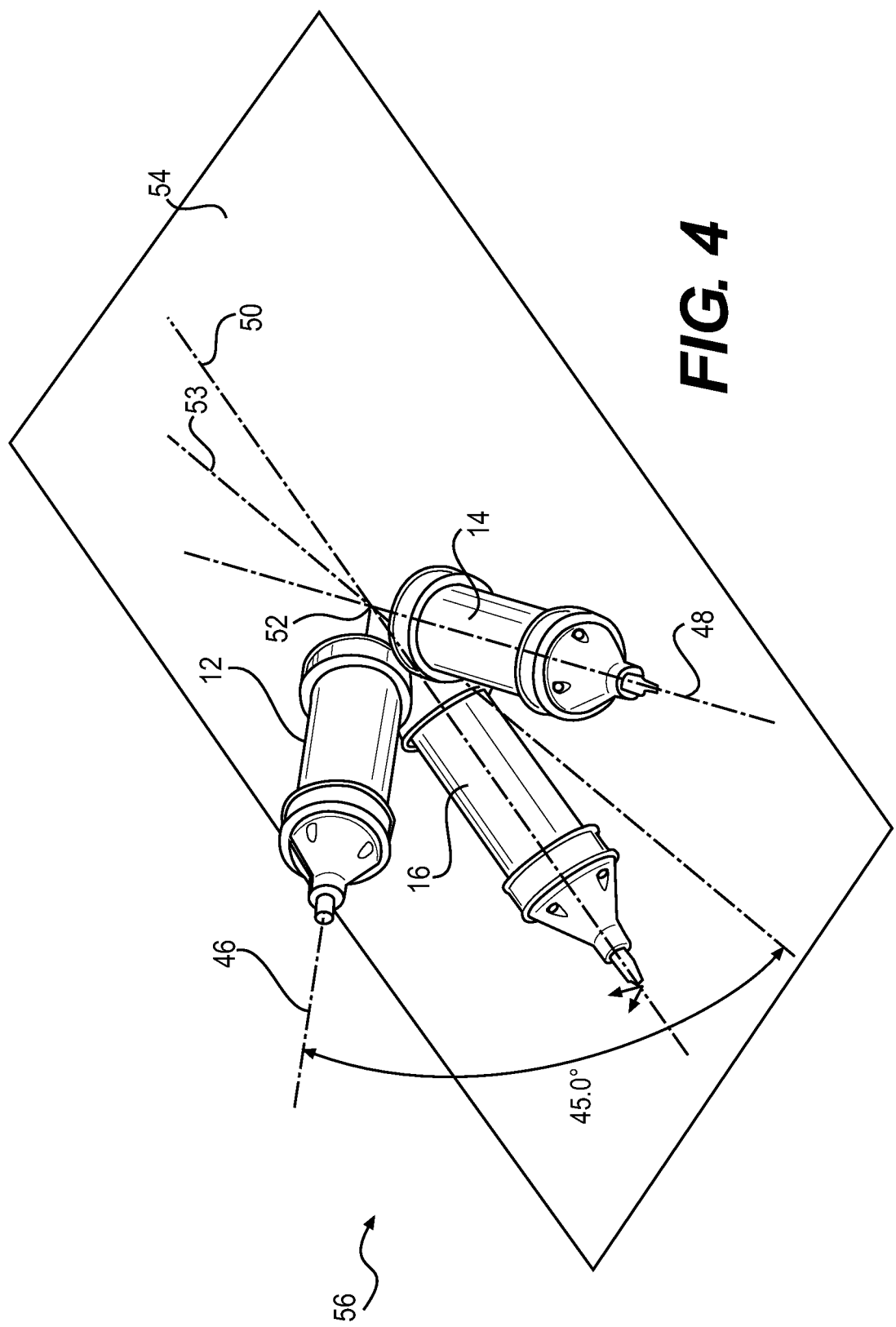
FIG. 4 is a perspective view of the magnetometers of the magnetic sensor assembly of FIG. 1, illustrating their relative position one with respect to the others.

As can be seen in FIG. 3, the external surface 40 of first scalar magnetometer 12 is cylindrical having a lower end cap 42 and an upper end cap 44. First scalar magnetometer 12 also has a central longitudinal axis 46. Referring to FIG. 4, it can also be seen that second scalar magnetometer 14 has a central longitudinal axis 48, and that third scalar magnetometer 16 has a central longitudinal axis 50. In this embodiment, the external structures of the second scalar magnetometer 14 and the third scalar magnetometer 16 are identical to those of the first scalar magnetometer 12 and will not be described in further detail here. It should be understood that this is not required to be the case, and in other embodiments, the external structures of the various scalar magnetometers need not be identical.

Referring still to FIG. 4, in this embodiment, the central longitudinal axis 46 (of the first scalar magnetometer 12), the central longitudinal axis 48 (of the second scalar magnetometer 14), and the central longitudinal axis 50 (of the third scalar magnetometer 16) meet at a point 52 and form a pyramidal structure having an equilateral triangle as base. A plane 54, which is parallel to both the central longitudinal axis 48 (of the second scalar magnetometer 14), and the central longitudinal axis 50 (of the third scalar magnetometer 16) is formed. In this embodiment because of the aforementioned pyramidal structure central longitudinal axis 48 and the central longitudinal axis 50 are both on the plane 54. An angle 56 is formed between the intersection of central longitudinal axis 46 (of the first scalar magnetometer 12) and plane 54. (For ease of reference the angle 56 is shown as being between the central longitudinal axis 46 and an imaginary line 53 lying in plane 54.) In this embodiment, the angle 56 measures 45°. Although not shown in the figure, similar angles and planes could be drawn from the point of view of the second scalar magnetometer 14 and the third scalar magnetometer 16. Because the magnetometers 12, 14, 16 are identical and because they are in pyramidal structure having an equilateral triangle as its base, such figures would be identical to FIG. 4 (with the exception of the relative positions of each of the magnetometers) and are therefore not reproduced herein. It should be understood that the relative positioning of the various scalar magnetometers 12, 14, 16 described in relation to this embodiment is only exemplary. In other embodiments such relative positioning may vary. As long as the principle that the operating ranges of the various magnetometers mesh together to allow for sensing as the orientation of the magnetic sensor assembly with respect to the field lines of an ambient magnetic field vary, no relative positioning of magnetometers is required.

As is the case for scalar magnetometers in general, in this embodiment each of the scalar magnetometers 12, 14, 16 has an operational range (with respect to the field lines of an ambient magnetic field) within which it is capable of operating. In the present embodiment, the operational range of each of the scalar magnetometers 12, 14, 16 is for angles of between 21° and 69° (inclusive) and between 111° and 159° (inclusive) formed between the magnetometer's central longitudinal axis and the ambient magnetic field lines. Because, in this embodiment, the scalar magnetometers 12, 14, 16 are identical, their operational ranges are identical. Having scalar magnetometers with identical operational ranges is not, however, required by the present technology. Thus, in other embodiments, the operational ranges of the various scalar magnetometers might vary and would thus not be identical to one another. It should also be understood that the operational ranges of magnetometers varies and the above-noted values given for such ranges are exemplary only.

Figure 5:
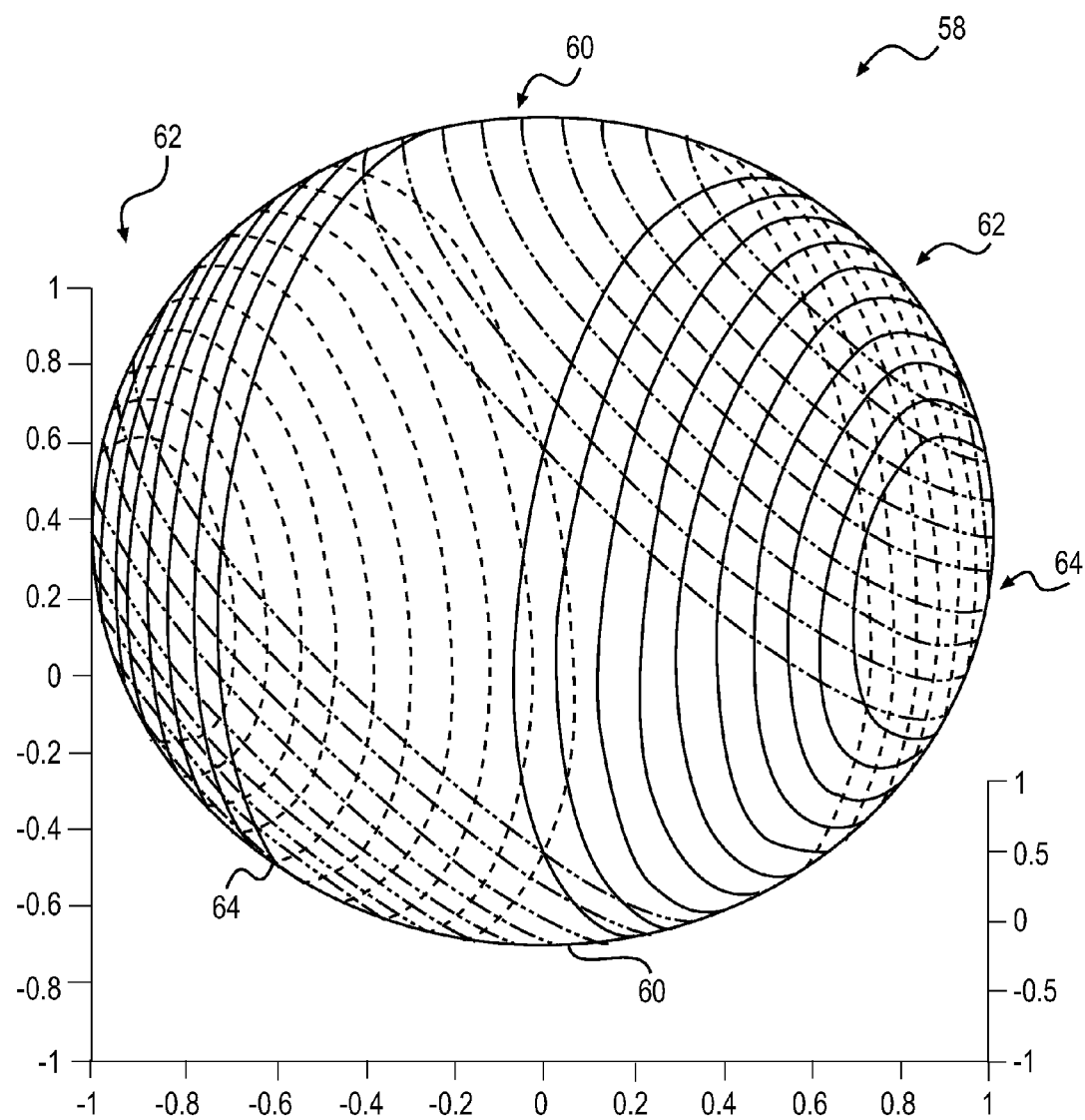
FIG. 5 is a sphere showing the operative ranges of the magnetometers of the magnetic sensor assembly of FIG. 1.
Figure 6:
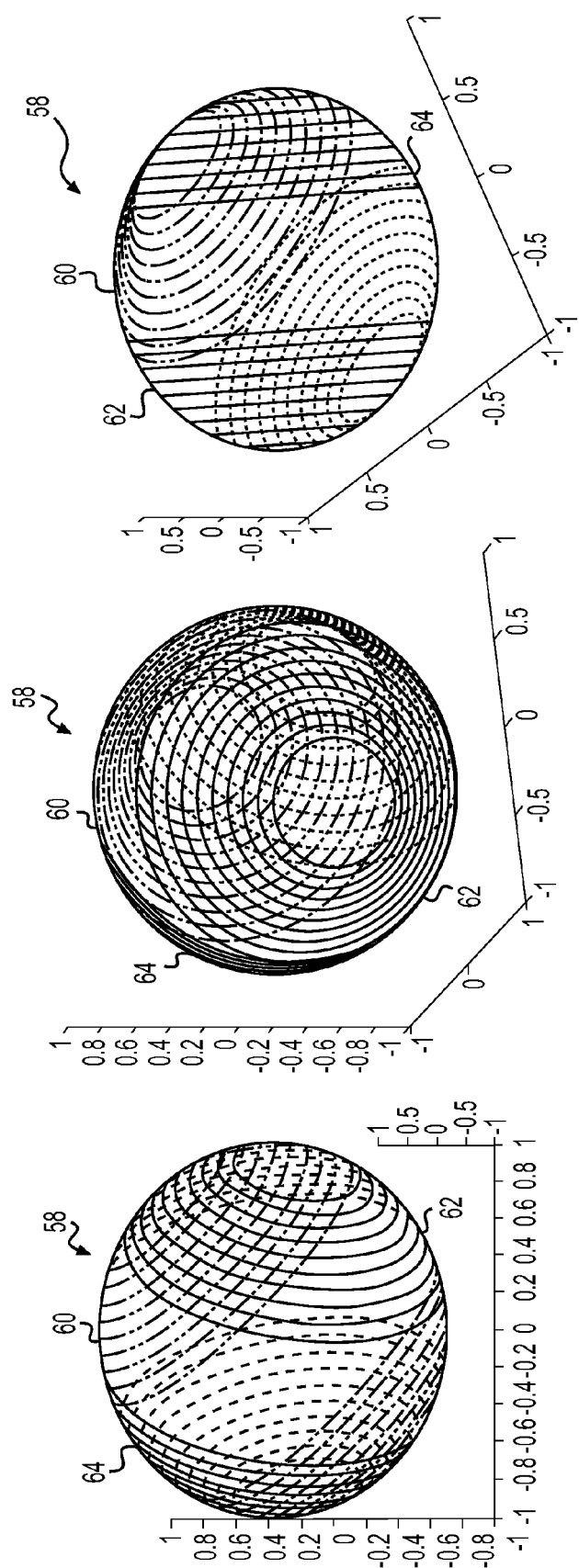
FIGS. 6A, 6B, and 6C show the sphere of FIG. 5 from different angles.

In this embodiment, the magnetometers 12, 14, 16 are positioned within the magnetic sensor assembly 10 such that every point of a sphere 58 (shown in FIG. 5) surrounding the magnetic sensor assembly 10 is within the operational range of at least one of the magnetometers 12, 14, 16. In some cases, in this embodiment, a point may be within the operational range of more than one of the magnetometers 12, 14, 16 as their operational ranges overlap with respect to the sphere 58. In FIG. 5, the operational range of the first scalar magnetometer 12 is bands illustrated by dot-dash lines and identified by reference numeral 60. The operational range of the second scalar magnetometer 14 is bands illustrated by solid lines and identified by reference number 62. The operational range of the third scalar magnetometer 16 is bands illustrated by dash lines and identified by reference number 64. FIGS. 6A, 6B, and 6C show the sphere 58 from different angles to allow for an appreciation that every point of the sphere 58 is within the operational range of at least one (and in some case more—where the bands are shown to overlap) scalar magnetometer 12, 14, 16. (The axes shown in the Figures illustrate a sphere with a nominal radius of 1.) It should be understood that the present technology does not require an overlap of the operational ranges of two (or more) different magnetometers, and thus in some embodiments such overlap may not exist (as it does in the present embodiment).

It should be understood that the above description of the various angles and operational ranges is intended to be exemplary and not limiting. Thus, as long as the principle that the operational ranges of the various magnetometers mesh together to allow for sensing as the orientation of the magnetic sensor assembly with respect to the field lines of an ambient magnetic field varies, no particular angles, operational ranges, numbers of magnetometers or relative arrangements of magnetometers are required.

In this embodiment, each of the scalar magnetometers 12, 14, 16 outputs a signal through a wire 66a, 66b, 66c (respectively) connected thereto (shown in FIG. 10). Similarly, vector magnetometer 18 outputs a signal through a wire 66d connected thereto. In other embodiments, other types (e.g. digital signals) of signals might be present. It is not necessary that the types of signal be the same for each of the magnetometers, and thus in various other embodiments of the present technology, they may differ.

Figure 7:
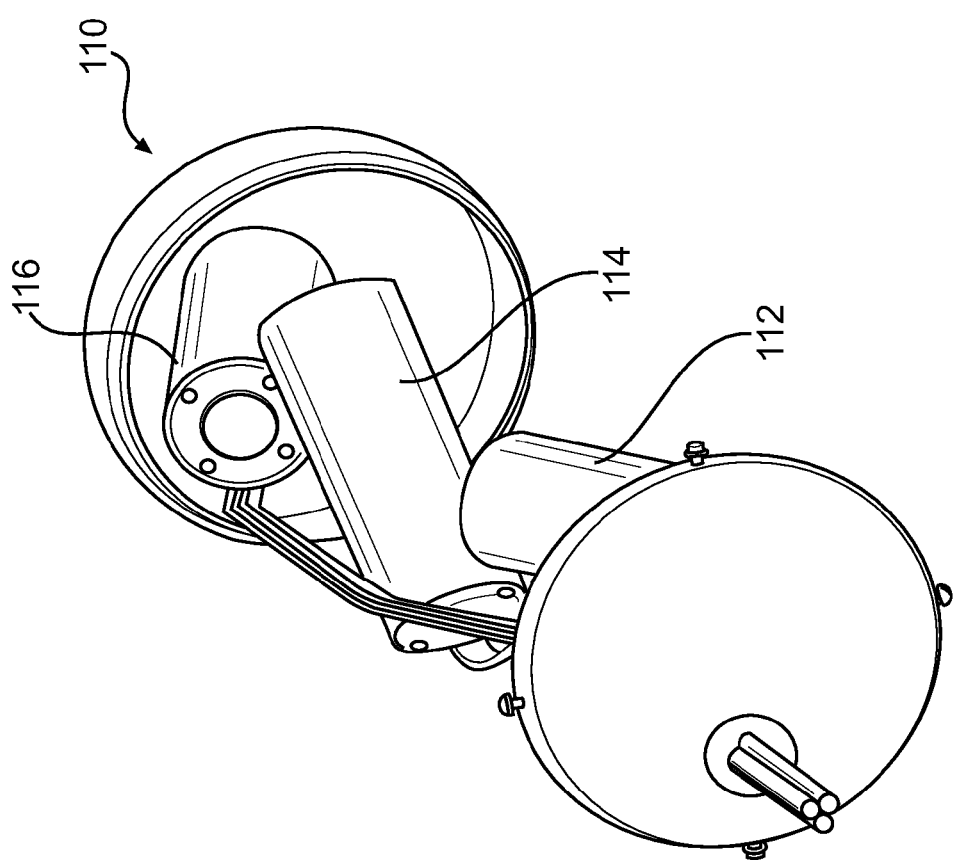
FIG. 7 is a perspective view of parts of a magnetic sensor assembly being a second embodiment of the present technology.
Figure 8:
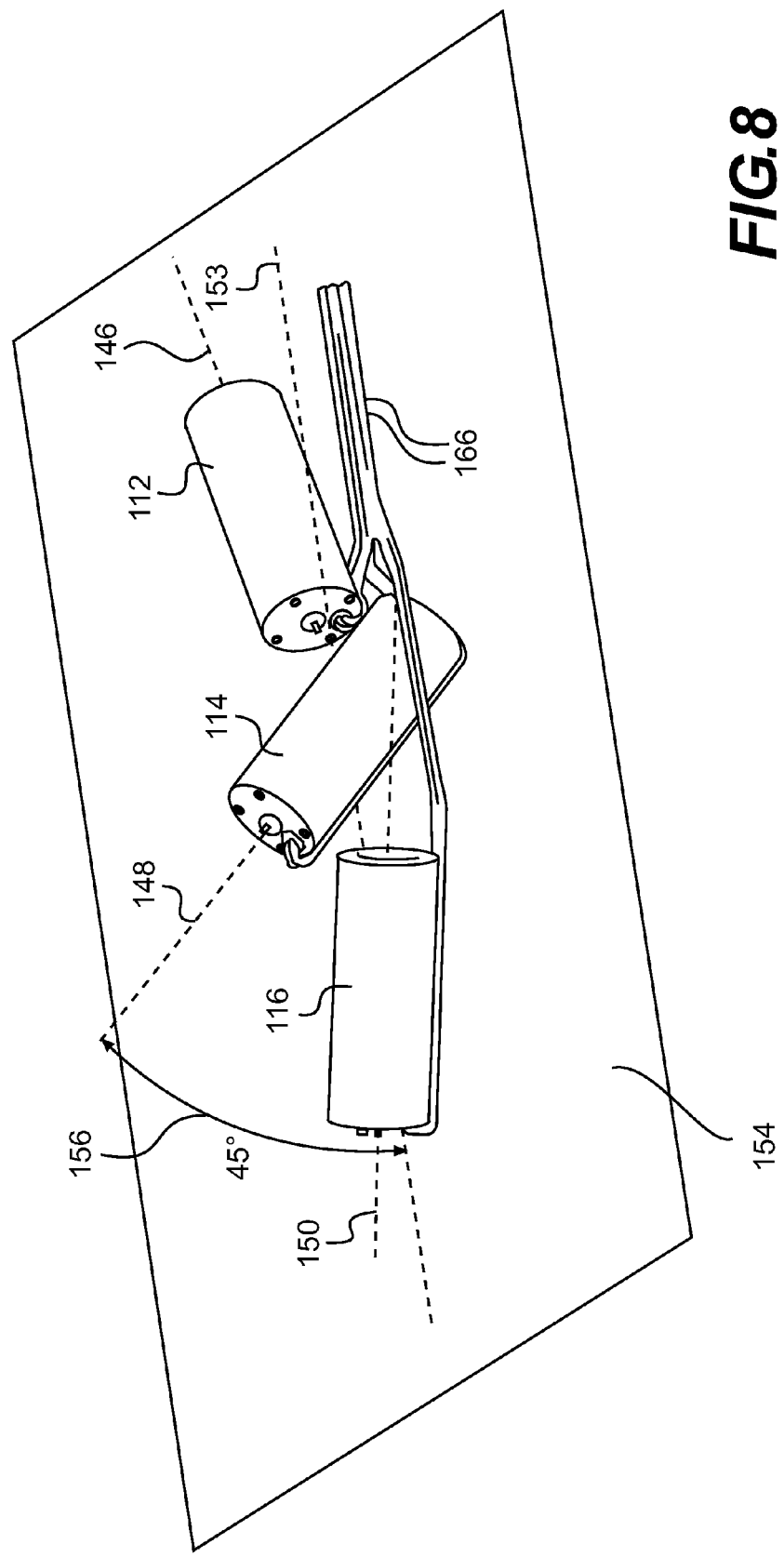
FIG. 8 is a perspective view of the magnetometers of the magnetic sensor assembly of FIG. 7, illustrating their relative position one with respect to the others.

FIGS. 7 and 8 show a magnetic sensor assembly 110 being another embodiment of the present technology. Magnetic sensor assembly 110 is similar to magnetic sensor assembly 10, with the exception that the scalar magnetometers 112, 114, 116 are arranged linearly one with respect to another (as opposed to pyramidally as they were in the first embodiment, magnetic sensor assembly 10). In this embodiment, the each of the magnetometers 112, 114, 116 are identical to the magnetometers 12, 14, 16 of the previous embodiment. Thus each of the magnetometers 112, 114, 116 has a central longitudinal axis 146, 148, 150 (respectively). It should be understood that an assembly mounting the various magnetometers 112, 114, 116 is not shown in FIGS. 7 and 8 in order to provide for an easier understanding. A suitable mounting structure is present in this embodiment, although not shown. As would be understood by a person of skill in the art, many different mounting structures might be employed. Similarly a vector magnetometer is not shown in FIGS. 7 & 8 in order to provide for an easier understanding. In this embodiment, the vector magnetometer is identical to vector magnetometer 18 of the previous embodiment, although this is not required to be the case in other embodiments. As would be understood by a person of ordinary skill in the art, many different mounting structures could be used to mount the vector magnetometer.

As shown in FIG. 8 a plane 154, which is parallel to both the central longitudinal axis 146 (of the first scalar magnetometer 112), and the central longitudinal axis 150 (of the third scalar magnetometer 116) is formed. (In this embodiment central longitudinal axis 146 and the central longitudinal axis 150 are both on the plane 154.) An angle 156 is formed between the intersection of central longitudinal axis 148 (of the second scalar magnetometer 114) and plane 154. For ease of understanding, the angle 156 is shown as between central longitudinal axis 148 and an imaginary line 153 within the plane 154. In this embodiment, the angle 156 measures 45°. Although not shown in the figure, similar angles and planes should be drawn from the point of view of the first scalar magnetometer 112 and the third scalar magnetometer 116. In this embodiment, each of the angles for the each of the magnetometers is 45°. As in this embodiment the scalar magnetometers are the same as those of the earlier embodiment, and given that the relative angles between then also the same (45°) as in the earlier embodiment, FIGS. 5, 6a, 6b, and 6c, also illustrate the operating ranges for each of the magnetometers in this embodiment.

Figure 9:
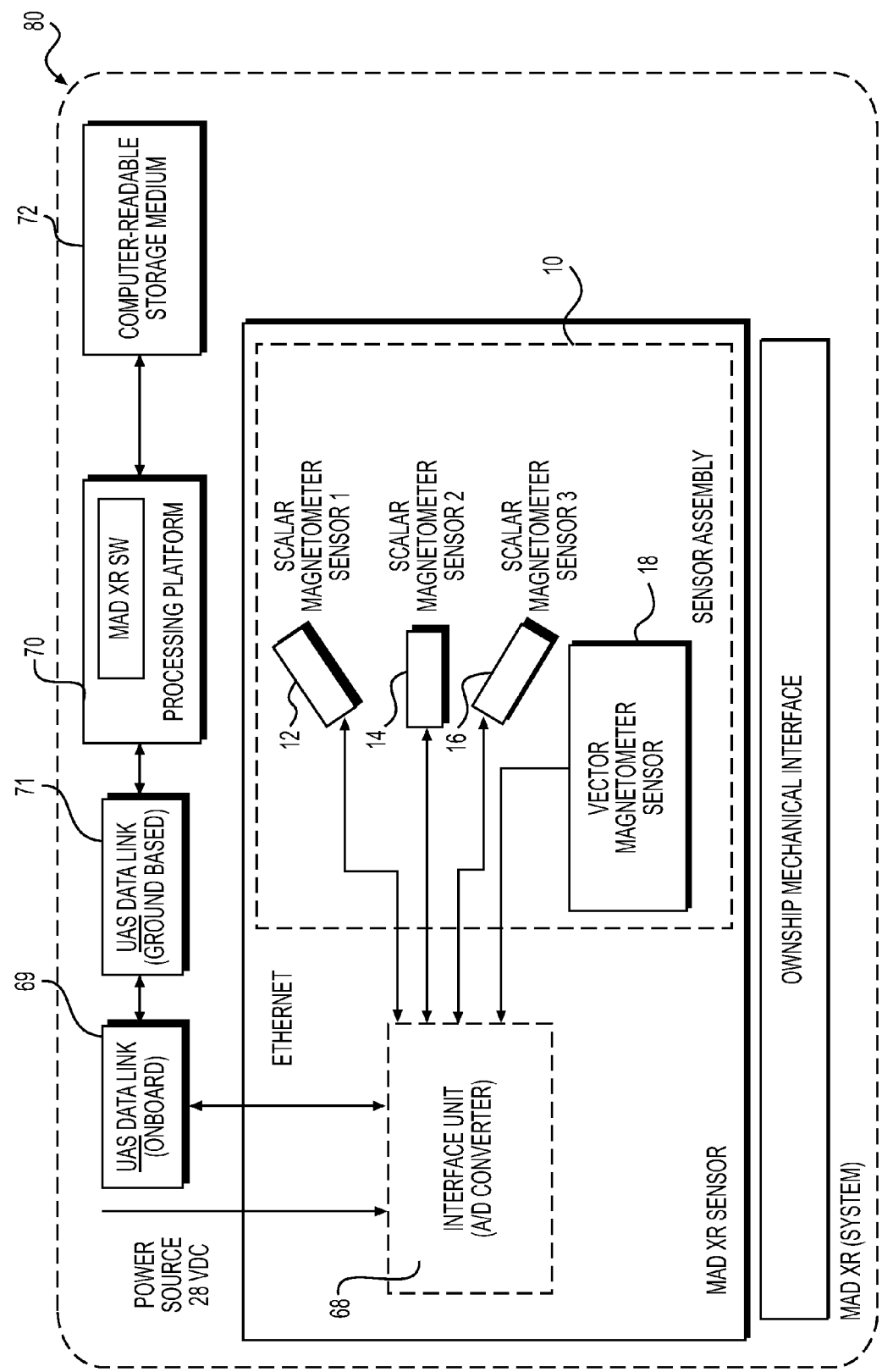
FIG. 9 is a schematic view of the magnetic sensor assembly of FIG. 1.

FIG. 9 shows a specific embodiment of a magnetic sensor system 80 of the present technology. Magnetic sensor system 80 includes a magnetic sensor assembly which may, for example, be magnetic sensor assembly 10 or magnetic sensor assembly 110. In this embodiment, magnetic sensor assembly 10 or 110 (a part of magnetic sensor system 80) is mounted on an unmanned aerial vehicle (system) ("UAS") (not shown in the drawings). As can be seen in FIG. 9, in this embodiment each of the scalar magnetometers 12, 14, 16 or 112, 114, 116 (as the case may be) and the vector magnetometer 18 of the magnetic sensor assembly 10 or 110 outputs a signal(s). In this embodiment, each of the magnetometers 12, 14, 16, 18 or 112, 114, 116 (as the case may be) are in electronic communication with an interface unit 68, which includes a frequency-to-digital converter which converts (but does not combine) each of the output signals from the scalar magnetometers into digital signals, and an analog-to-digital converter which converts each of the analog signals from the vector magnetometer into digital signals. (In other embodiments, were the magnetometers to output a digital signal, no frequency-to-digital and/or analog-to digital converter would be required.) In digital communication with interface unit 68 is an on-board UAS Data Link 69, which includes a transmitter/receiver capable of transmitting/receiving an RF signal from/to the UAS to/from a receiver/transmitter capable of receiving/transmitting the signal (e.g. a ground-based receiver/transmitter UAS Data Link 71). (In this embodiment, the interface unit 68 is a circuit card made of standard components, and among the functions performed by such circuit card are the following: (i) frequency to digital conversion of scalar magnetometer signals; (2) control of the RF signals necessary to have the three sensor lights emitted; (3) digital measurement of the three sensor Larmor signal amplitudes (see below); (4) analog to digital conversion of the three outputs of the vector magnetometer; and (5) control, acquisition logic, communication, and Ethernet interface.)

In this embodiment, receiver/transmitter is shown as ground-based UAS Data Link 71. UAS Data Link 71 is in electronic communication (e.g. via a wired connection) with a ground-based computer processor 70. Computer processor 70 is in electronic communication with a ground-based computer-readable information storage medium 72, which contains various instructions for execution by the computer processor 70. Amongst such instructions is a switching algorithm the computer processor 70 uses to determine which of the signals (from which of the scalar magnetometers 12, 14, 16) to use in magnetic sensing.

In other embodiments, computer processor 70 and computer-readable information storage medium 72 might not be ground-based, but might be located within the UAS itself. Thus, in such embodiments, communications between the interface unit 68 and the computer processor 70 might take place over a direct wired connection, e.g. Ethernet. In such embodiments UAS data link 69 might be omitted as not being necessary.

In the present embodiments, as was described in part above, each of the scalar magnetometers 12, 14, 16 or 112, 114, 116 (as the case may be) operates in an optimal manner (i.e. highest signal to noise ratio in the measurement), when the amplitude of its output signal, known as a "Larmor signal" (in which frequency is proportional to the measured ambient magnetic field) within a particular narrow range. (This range is termed the operational range in this specification.) In the present embodiments, this range occurs when the angle (of the central longitudinal axis) with respect to the ambient magnetic field vector is close to 45 degrees (or 135 degrees). When the angle approaches zero or 90 degrees, then the Larmor signal amplitude diminishes; it will go to zero around zero and 90 degrees. Those angular regions around zero and 90 degrees are called dead zones. The dead zones (along with the operational ranges) for the three magnetometers of the present embodiments are described in FIGS. 5 and 6.

In the present embodiments, the switching algorithm (stored within computer-readable information storage medium 72 and executed via computer processor 70) generally works as follows: Via the output signal from the vector magnetometer 18, the orientation of the magnetic sensor assembly 10 or 110 can be calculated. Once that orientation has been calculated, based on stored information regarding the operational ranges of the various scalar magnetometers 12, 14, 16, or 112, 114, 116 (as the case may be), the one(s) of the scalar magnetometers being in the operational range(s) can be determined. The system 80 also maintains (via computer processor 70 and computer-readable information storage medium 72) information as to which output signal (from which scalar magnetometer 12, 14, 16, or 112, 114, 116 (as the case may be)) is then currently in use. The system 80 also has available to it the relative signal strengths between the output signals coming from the various scalar magnetometers 12, 14, 16, or 112, 114, 116 (as the case may be). All of this information may be taken into account by the switching algorithm when making a determination as to which scalar magnetometer's output signal to use in magnetic sensing.

In the present embodiments, the switching algorithm is configured such that a compromise is made between always selecting the magnetometer having the best output signal (i.e. the one with highest Larmor signal) and switching too often between sensors. This is because in these embodiments, there is a slight performance penalty associated with switching between using the output of different magnetometers 12, 14, 16, or 112, 114, 116 (as the case may be), because the three magnetometers magnetometer 12, 14, 16, or 112, 114, 116 (as the case may be) are not located exactly at the same place in space. So when switching between two of them occurs, there is a small step in the signal (which can be compensated for but nevertheless does introduce a small amount of noise in the signal). Therefore the switching algorithm incorporates hysteresis (similar to a thermostat, for example) to prevent over-switching.

Magnetic sensor systems of the present technology (such as magnetic sensor system 80) may be used to detect bodies of subsurface ferromagnetic material. Examples of such bodies include ore bodies, pipelines, vessels, etc. Typically, magnetic sensor systems have magnetic sensor assemblies that are mounted on aerial vehicles, such as airplanes or helicopters, which fly over a surface under which a ferromagnetic material may be located.

Modifications and improvements to the above-described embodiments of the present invention may become apparent to those skilled in the art. The foregoing description is intended to be exemplary rather than limiting. The scope of the present invention is therefore intended to be limited solely by the scope of the appended claims.

The invention claimed is:

1. A magnetic sensor system suitable for sensing local variations in an ambient magnetic field caused by a mass of ferromagnetic material, the sensor system comprising:
   a magnetic sensor assembly, including;
      a first scalar point-sensor magnetometer, the first scalar point-sensor magnetometer having a first scalar magnetometer axis;
      a second scalar point-sensor magnetometer, the second scalar point-sensor magnetometer having a second scalar magnetometer axis;
      a third scalar point-sensor magnetometer, the third scalar point-sensor magnetometer having a third scalar magnetometer axis;
      the first scalar point-sensor magnetometer, the second scalar point-sensor magnetometer, and the third scalar point-sensor magnetometer being fixedly mounted with respect to one another such that (i) the position of each of the scalar magnetometer axes is invariable with respect to the other scalar magnetometer axes, and (ii) when the magnetic sensor assembly is in operation, at any particular point in time,
         the first scalar magnetometer axis forms a first angle with magnetic field lines of the ambient magnetic field at a location of the magnetic sensor assembly in a first plane defined by the first scalar magnetometer axis and the magnetic field lines,
         the second scalar magnetometer axis forms a second angle with the magnetic field lines of the ambient magnetic field at the location of the magnetic sensor assembly in a second plane defined by the second scalar magnetometer axis and the magnetic field lines,
         the third scalar magnetometer axis forms a third angle with the magnetic field lines of the ambient magnetic field at the location of the magnetic sensor assembly in a third plane defined by the third scalar magnetometer axis and the magnetic field lines,
         the first scalar magnetometer axis intersects a plane parallel to both the second scalar magnetometer axis and the third scalar magnetometer axis at a fourth angle,
         the second scalar magnetometer axis intersects a plane parallel to both the first scalar magnetometer axis and the third scalar magnetometer axis at a fifth angle, and
         the third scalar magnetometer axis intersects a plane parallel to both the first scalar magnetometer axis and the second scalar magnetometer axis at a sixth angle; and
      the first scalar point-sensor magnetometer having a first scalar magnetometer operating range defined with respect to a range of values of the first angle, the second scalar point-sensor magnetometer having a second scalar magnetometer operating range defined with respect to a range of values of the second angle, the third scalar point-sensor magnetometer having a third scalar magnetometer operating range defined with respect to a range of values of the third angle;
      the first scalar point-sensor magnetometer, the second scalar point-sensor magnetometer, and the third scalar point-sensor magnetometer positioned with respect to one another such that, at the particular point in time, at least one of: the first angle is within the first scalar magnetometer operating range, the second angle is within the second scalar magnetometer operating range, and the third angle is within the third scalar magnetometer operating range; and
   a non-transient computer-readable information storage medium storing program instructions that when executed by a computer processor determine which of a first output from the first scalar point-sensor magnetometer, a second output from the second scalar point-sensor magnetometer, and a third output from a third scalar point-sensor magnetometer is to be used at the particular point in time in the sensing of local variations in the ambient magnetic field.

2. The magnetic sensor system of claim 1, wherein the first output from the first scalar point-sensor magnetometer is a first output signal, the second output from the second scalar point-sensor magnetometer is a second output signal, the third output from the third scalar point-sensor magnetometer is a third output signal; and the magnetic sensor system further comprising:
- at least one frequency-to-digital converter converting the first output signal to a first digital output signal, the second output signal to a second digital output signal, and the third output signal to a third digital output signal;
- the computer processor, the computer processor being in communication with the at least one frequency-to-digital converter to receive the digital output signals therefrom.

3. The magnetic sensor system of claim 1, wherein the non-transient computer-readable information storage medium stores program instructions that when executed by the computer processor determine which of the first output signal, the second output signal, and the third output signal is to be used at the particular point in time in the sensing of local variations in the ambient magnetic field based, at least in part, on which of the scalar point-sensor magnetometers has its angle within its operating range at the particular point in time.

4. The magnetic sensor system of claim 3, wherein, at the particular point in time, more than one of the scalar point-sensor magnetometers has its angle within its operating range.

5. The magnetic sensor system of claim 1, wherein the non-transient computer-readable information storage medium stores program instructions that when executed by the computer processor determine which of the first output signal, the second output signal, and the third output signal is to be used at the particular point in time in the sensing of local variations in the ambient magnetic field based, at least in part, on a strength of the scalar magnetometer output signals.

6. The magnetic sensor system of claim 1, wherein the non-transient computer-readable information storage medium stores program instructions that when executed by the computer processor determine which of the first output signal, the second output signal, and the third output signal is to be used at the particular point in time in the sensing of local variations in the ambient magnetic field based, at least in part, on which one of the output signals was being used immediately prior to the particular point in time.

7. The magnetic sensor system of claim 1, wherein the first scalar point-sensor magnetometer, the second scalar point-sensor magnetometer, and the third scalar point-sensor magnetometer are positioned one with respect to another to form a pyramidal structure.

8. The magnetic sensor system of claim 1, wherein the first scalar magnetometer, the second scalar magnetometer, and the third scalar magnetometer are positioned in-line with respect to one another.

9. The magnetic sensor system of claim 1, wherein
the fourth angle is between 35° and 55° (inclusive), or between 125° and 145° (inclusive), or between 215° and 235° (inclusive), or between 305° and 325° (inclusive);
the fifth angle is between 35° and 55° (inclusive), or between 125° and 145° (inclusive), or between 215° and 235° (inclusive), or between 305° and 325° (inclusive); and
the sixth angle is between 35° and 55° (inclusive), or between 125° and 145° (inclusive), or between 215° and 235° (inclusive), or between 305° and 325° (inclusive).

10. The magnetic sensor system of claim 1, wherein the first scalar magnetometer operating range is between 10° and 80° (inclusive) and between 100° and 170° (inclusive); the second scalar magnetometer operating range is between 10° and 80° (inclusive) and between 100° and 170° (inclusive); and the third scalar magnetometer operating range is between 10° and 80° (inclusive) and between 100° and 170° (inclusive).

11. The magnetic sensor system of claim 1, wherein each of the scalar point-sensor magnetometers is an optical pumping magnetometer.

12. The magnetic sensor system of claim 2, further comprising a vector magnetometer, the vector magnetometer having a fourth analog output signal, a fifth analog output signal, and a sixth analog output signal; and at least one analog-to-digital converter converting the fourth analog output signal to a fourth digital output signal, the fifth analog output signal to a fifth digital output signal, and the sixth analog output signal to a sixth digital output signal.

13. The magnetic sensor system of claim 1, wherein the magnetic sensor assembly is mounted in a moving vehicle.

14. A method of operating a magnetic sensor system suitable for sensing of local variations in an ambient magnetic field caused by a mass of ferromagnetic material the magnetic sensor system having a magnetic sensor assembly including:
- a first scalar point-sensor magnetometer, the first scalar point-sensor magnetometer having a first scalar magnetometer axis;
- a second scalar point-sensor magnetometer, the second scalar point-sensor magnetometer having a second scalar magnetometer axis;
- a third scalar point-sensor magnetometer, the third scalar point-sensor magnetometer having a third scalar magnetometer axis;
- the first scalar point-sensor magnetometer, the second scalar point-sensor magnetometer, and the third scalar point-sensor magnetometer being fixedly mounted with respect to one another such that (i) the position of each of the scalar magnetometer axes is invariable with respect to the other scalar magnetometer axes, and (ii) when the magnetic sensor assembly is in operation, at any particular point in time,
- the first scalar magnetometer axis forms a first angle with magnetic field lines of the ambient magnetic field at a location of the magnetic sensor assembly in a first plane defined by the first scalar magnetometer axis and the magnetic field lines,
- the second scalar magnetometer axis forms a second angle with the magnetic field lines of the ambient magnetic field at the location of the magnetic sensor assembly in a second plane defined by the second scalar magnetometer axis and the magnetic field lines,
- the third scalar magnetometer axis forms a third angle with the magnetic field lines of the ambient magnetic field at the location of the magnetic sensor assembly in a third plane defined by the third scalar magnetometer axis and the magnetic field lines,
- the first scalar magnetometer axis intersects a plane parallel to both the second scalar magnetometer axis and the third scalar magnetometer axis at a fourth angle, the second scalar magnetometer axis intersects a plane parallel to both the first scalar magnetometer axis and the third scalar magnetometer axis at a fifth angle, and the third scalar magnetometer axis intersects a plane parallel to both the first scalar magnetometer axis and the second scalar magnetometer axis at a sixth angle; and the first scalar point-sensor magnetometer having a first scalar magnetometer operating range defined with respect to a range of values of the first angle, the second scalar point-sensor magnetometer having a second scalar magnetometer operating range defined with respect to a range of values of the second angle, the third scalar point-sensor magnetometer having a third scalar magnetometer operating range defined with respect to a range of values of the third angle; and the first scalar point-sensor magnetometer, the second scalar point-sensor magnetometer, and the third scalar point-sensor magnetometer positioned with respect to one another such that, at the particular point in time, at least one of: the first angle is within the first scalar magnetometer operating range, the second angle is within the second scalar magnetometer operating range, and the third angle is within the third scalar magnetometer operating range;

the method comprising:

receiving, by a computer processor in electronic communication with the first scalar point-sensor magnetometer, a first output signal from the first scalar point-sensor magnetometer;

receiving, by the computer processor in electronic communication with the second scalar point-sensor magnetometer, a second output signal from the second scalar point-sensor magnetometer, the second output signal being distinct from the first output signal;

receiving, by the computer processor in electronic communication with the third scalar point-sensor magnetometer, a third output signal from third scalar point-sensor magnetometer, the third output signal being distinct from both the first output signal and the second output signal;

determining, via the computer processor, which of the first output signal, the second output signal and the third output signal to use at the particular point in time in the sensing of local variations in the ambient magnetic field.

15. The method of operating a magnetic sensor system of claim 14, wherein determining, via the computer processor, which of the first output signal, the second output signal and the third output signal to use at the particular point in time in the sensing of local variations in the ambient magnetic field, is determining, at least in part, which of the first output signal, the second output signal and the third output signal to use at the particular point in time in the sensing of local variations in the ambient magnetic field, based, at least in part, on which of the scalar point-sensor magnetometers has its angle within its operating range at the particular point in time.

16. The method of operating a magnetic sensor system of claim 15, wherein, at the particular point in time, more than one of the scalar point-sensor magnetometers has its angle within its operating range.

17. The method of operating a magnetic sensor system of claim 14, wherein determining, via the computer processor, which of the first output signal, the second output signal and the third output signal to use at the particular point in time in the sensing of local variations in the ambient magnetic field, is determining, at least in part, which of the first output signal, the second output signal and the third output signal to use at the particular point in time in the sensing of local variations in the ambient magnetic field, based, at least in part, on a strength of the scalar point-sensor magnetometer output signals.

18. The method of operating a magnetic sensor system of claim 14, wherein determining, via the computer processor, which of the first output signal, the second output signal and the third output signal to use at the particular point in time in the sensing of local variations in the ambient magnetic field, is determining, at least in part, which of the first output signal, the second output signal and the third output signal to use at the particular point in time in the sensing of local variations in the ambient magnetic field, based, at least in part, on which one of the output signals was being used immediately prior to the particular point in time.

19. A magnetic sensor assembly suitable for use in a magnetic sensor system for sensing local variations in an ambient magnetic field caused by a mass of ferromagnetic material, the sensor assembly comprising:

a first scalar point-sensor magnetometer, the first scalar point-sensor magnetometer having a first scalar magnetometer axis;

a second scalar point-sensor magnetometer, the second scalar point-sensor magnetometer having a second scalar magnetometer axis;

a third scalar point-sensor magnetometer, the third scalar point-sensor magnetometer having a third scalar magnetometer axis;

the first scalar point-sensor magnetometer, the second scalar point-sensor magnetometer, and the third scalar point-sensor magnetometer being fixedly mounted with respect to one another such that (i) the position of each of the scalar magnetometer axes is invariable with respect to the other scalar magnetometer axes, and (ii) when the magnetic sensor assembly is in operation, at any particular point in time, the first scalar magnetometer axis forms a first angle with magnetic field lines of the ambient magnetic field at a location of the magnetic sensor assembly in a first plane defined by the first scalar magnetometer axis and the magnetic field lines, the second scalar magnetometer axis forms a second angle with the magnetic field lines of the ambient magnetic field at the location of the magnetic sensor assembly in a second plane defined by the second scalar magnetometer axis and the magnetic field lines, the third scalar magnetometer axis forms a third angle with the magnetic field lines of the ambient magnetic field at the location of the magnetic sensor assembly in a third plane defined by the third scalar magnetometer axis and the magnetic field lines, the first scalar magnetometer axis intersects a plane parallel to both the second scalar magnetometer axis and the third scalar magnetometer axis at a fourth angle, the second scalar magnetometer axis intersects a plane parallel to both the first scalar magnetometer axis and the third scalar magnetometer axis at a fifth angle, and the third scalar magnetometer axis intersects a piano parallel to both the first scalar magnetometer axis and the second scalar magnetometer axis at a sixth angle; and the first scalar point-sensor magnetometer having a first scalar magnetometer operating range defined with respect to a range of values of the first angle, the second scalar point-sensor magnetometer having a second scalar magnetometer operating range defined with respect to a range of values of the second angle, the third scalar point-sensor magnetometer having a third scalar magnetometer operating range defined with respect to a range of values of the third angle; and the first scalar point-sensor magnetometer, the second scalar point-sensor magnetometer, and the third scalar point-sensor magnetometer positioned with respect to one another such that, at the particular point in time, at least one of: the first angle is within the first scalar magnetometer operating range, the second angle is within the second scalar magnetometer operating range, and the third angle is within the third scalar magnetometer operating range.

20. The magnetic sensor assembly of claim 19, wherein the first scalar point-sensor magnetometer, the second scalar point-sensor magnetometer, and the third scalar point-sensor magnetometer are positioned one with respect to another to form a pyramidal structure.

21. The magnetic sensor assembly of claim 20, wherein the fourth angle is between 35° and 55° (inclusive), or between 125° and 145° (inclusive), or between 215° and 235° (inclusive), or between 305° and 325° (inclusive);

the fifth angle is between 35° and 55° (inclusive), or between 125° and 145° (inclusive), or between 215° and 235° (inclusive), or between 305° and 325° (inclusive); and the sixth angle is between 35° and 55° (inclusive), or between 125° and 145° (inclusive), or between 215° and 235° (inclusive), or between 305° and 325° (inclusive).

* * * * *